(12) United States Patent
Hasebe et al.

(10) Patent No.: US 7,727,589 B2
(45) Date of Patent: Jun. 1, 2010

(54) METHOD OF PRODUCING ESTHETICALLY PLEASING ORNAMENTS FROM BONE COMPONENTS

(75) Inventors: Terumitsu Hasebe, Kawasakishi (JP); Tetsuya Suzuki, 1-2-406, Chigasakihigashi 1-chome, Tsuzuki-ku, Yokohamashi, Kanagawa 224-0033 (JP)

(73) Assignee: Tetsuya Suzuki, Yokohama (JP)

( * ) Notice: Subject to any disclaimer, the term of this patent is extended or adjusted under 35 U.S.C. 154(b) by 1042 days.

(21) Appl. No.: 11/408,276

(22) Filed: Apr. 20, 2006

(65) Prior Publication Data

US 2006/0239895 A1 Oct. 26, 2006

(30) Foreign Application Priority Data

Apr. 22, 2005 (JP) ............................. 2005-153060

(51) Int. Cl.
*C23C 16/00* (2006.01)

(52) U.S. Cl. .................. 427/248.1; 427/37; 427/249; 427/255; 427/255.3; 427/294; 428/173; 204/173; 118/534; 118/600

(58) Field of Classification Search .............. 427/248.1; 118/715
See application file for complete search history.

(56) References Cited

U.S. PATENT DOCUMENTS

| | | | | |
|---|---|---|---|---|
| 4,430,760 A | * | 2/1984 | Smestad | 623/10 |
| 4,504,519 A | * | 3/1985 | Zelez | 427/577 |
| 5,562,952 A | * | 10/1996 | Nakahigashi et al. | 427/534 |
| 5,794,801 A | * | 8/1998 | Lemelson | 428/698 |
| 7,255,743 B2 | * | 8/2007 | VandenBiesen et al. | 117/84 |
| 2004/0154528 A1 | | 8/2004 | Page et al. | |

FOREIGN PATENT DOCUMENTS

| | | |
|---|---|---|
| JP | 59-211447 | 11/1984 |
| JP | 62-53663 | 3/1987 |
| JP | 05-294752 | 11/1993 |
| JP | 06-178655 | 6/1994 |
| JP | 07-048109 | 2/1995 |
| JP | 07-075831 | 3/1995 |
| JP | 08-004770 | 1/1996 |
| JP | 09-227403 | 9/1997 |
| JP | 09-285956 | 11/1997 |
| JP | 10-117702 | 5/1998 |
| JP | 10-234843 | 9/1998 |
| JP | 10-298082 | 11/1998 |
| JP | 2000-004802 | 1/2000 |
| JP | 2000-247896 | 9/2000 |
| JP | 2001-302539 | 10/2001 |
| JP | 2001-309970 | 11/2001 |
| JP | 2001-346818 | 12/2001 |
| JP | 2001-525718 | 12/2001 |
| JP | 2002-171917 | 6/2002 |
| JP | 2003-018965 | 1/2003 |
| JP | 2003-116468 | 4/2003 |
| JP | 2003-199510 | 7/2003 |
| JP | 2004-049178 | 2/2004 |
| JP | 2004-231616 | 8/2004 |
| JP | 2004-269333 | 9/2004 |
| WO | WO 03/008084 A1 | 1/2003 |
| WO | WO 2004/078058 A1 | 9/2004 |
| WO | WO 2004/105540 A1 | 12/2004 |

\* cited by examiner

*Primary Examiner*—Nadine Norton
*Assistant Examiner*—Maki Angadi
(74) *Attorney, Agent, or Firm*—Knobbe Martens Olson & Bear LLP

(57) ABSTRACT

Carbon components contained in large quantities in bone components are isolated. The isolated carbon components are gasified and plasma-processed by means of microwave or high-frequency heating and the etching curing of hydrogen atoms is utilized to form diamond-like film on the surface of the base material to produce an esthetically pleasing ornament.

9 Claims, No Drawings

METHOD OF PRODUCING ESTHETICALLY PLEASING ORNAMENTS FROM BONE COMPONENTS

BACKGROUND OF THE INVENTION

1. Field of the Invention

The present invention relates to an effective utilization of industrial waste and more specifically to a method of producing esthetically pleasing ornaments from bone components, in which carbon components in bone components are gasified and plasma-processed and the etching effect of hydrogen atoms is utilized to form thin diamond-like carbon (DLC) film on the surface of the base material.

2. Description of the Related Art

Traditional processes in the meat industry and medical industry produce large quantities of animal bones, some of which are incinerated as waste. As shown in the patent literatures listed below, waste animal bones produced from the meat industry are partially dried, crushed and mixed with powders made from dried organs, etc., to be utilized as condiments and other food materials.

Since waste animal bones contain a lot of calcium, phosphate and potassium, they are also made into ash and used as a component of fertilizer for promoting the growth of plant roots and blooming of flowers. Although waste bones are utilized effectively as explained above, the absolute supply quantity is huge and not all waste bones are effectively utilized. As a result, there has been a need for new applications in which they can be utilized effectively.

As described above, animal bones are utilized in numerous fields, main examples of which include: feeds such as animal feeds (as disclosed in Japanese Patent Laid-open Nos. 2004-49178 and Hei 10-117702) and nutrition-enriched feed compositions (as disclosed in Japanese Patent Laid-open Nos. 2003-199510 and 2000-4802), fish farming feed (as disclosed in Japanese Patent Laid-open No. 2003-18965), and chicken farming feeds (as disclosed in Japanese Patent Laid-open Nos. 2002-171917 and Hei 6-178655); applications for reinforcing bones and promoting bone growth such as bone-formation accelerators and fortifiers (as disclosed in Japanese Patent Laid-open Nos. 2004-231616, 2001-302539, Hei 10-298082 and Hei 9-227403), and composition for prevention of bone mass reduction (as disclosed in Japanese Patent Laid-open No. 2000-247896); and condiments such as meat and bone meal (as disclosed in Japanese Patent Laid-open No. 2003-116468). Examples for medical use include artificial bones (as disclosed in Japanese Patent Laid-open Nos. 2001-346818, 2004-269333, Hei 7-048109 and Hei 5-294752), improvement of bone adhesion (as disclosed in Published Japanese Translation No. 2001-525718 of PCT International Patent Publication No. WO99/45979 and Japanese Patent Laid-open No. Hei 10-234843), bone implant materials (as disclosed in Japanese Patent Laid-open Nos. Sho 62-053663 and Sho 59-211447), and composite biomaterial intended for dental cement (as disclosed in Japanese Patent Laid-open No. 2001-309970). The applications for agricultural, forestry and medical uses are limited to those in which enzymes and proteins contained in bones are utilized, and in the area of industrial chemical processes only applications as sintered abrasives and sliding members (as disclosed in Japanese Patent Publication (Examined) No. Hei 7-075831 and Japanese Patent Nos. 3121274 and 3590992) are known. Presently, animal bones are rarely used as functional materials.

Related art references in this case are as follows:
Japanese Patent Laid-open No. 2004-49178
Japanese Patent Laid-open No. Hei 10-117702
Japanese Patent Laid-open No. 2003-199510
Japanese Patent Laid-open No. 2000-004802
Japanese Patent Laid-open No. 2003-018965
Japanese Patent Laid-open No. 2002-171917
Japanese Patent Laid-open No. Hei 06-178655
Japanese Patent Laid-open No. 2004-231616
Japanese Patent Laid-open No. 2001-302539
Japanese Patent Laid-open No. Hei 10-298082
Japanese Patent Laid-open No. Hei 09-227403
Japanese Patent Laid-open No. 2000-247896
Japanese Patent Laid-open No. 2003-116468
Japanese Patent Laid-open No. 2001-346818
Japanese Patent Laid-open No. 2004-269333
Japanese Patent Laid-open No. Hei 07-048109
Japanese Patent Laid-open No. Hei 05-294752
Published Japanese Translation No. 2001-525718 of PCT International Patent Publication No. WO99/45979
Japanese Patent Laid-open No. Hei 10-234843
Japanese Patent Laid-open No. Sho 62-053663
Japanese Patent Laid-open No. Sho 59-211447
Japanese Patent Laid-open No. 2001-309970
Japanese Patent Publication (Examined) No. Hei 07-075831
Japanese Patent No. 3121274
Japanese Patent No. 3590992

On the other hand, the remarkable advancement of various industries of late has made it possible to use in many fields a number of composite materials combining the advantages of multiple materials including various metal materials, plastics and other organic polymer materials and other inorganic materials. Regarding these composite materials, surface reforming, or surface treatment of base material, is one of the technology areas that are drawing the most attention. Surface reforming can be implemented by adding chemical resistance, durability, wear resistance, hardness and other properties directly to the surface of conventional materials that already offer excellent machinability and are thus used in various industries. However, there are still a great number of materials that cannot be utilized, because they do not provide function suitable for the intended application or cannot demonstrate their natural function after surface reforming.

For this reason, there is a view that these materials can be used in greater applications once these drawbacks are improved, and therefore technologies to form thin diamond-like carbon (DLC) film, which is expected to improve durability such as chemical resistance, hardness and wear resistance, are drawing the attention and being applied in many fields. However, such applications also present concerns regarding the adhesion of thin film and various base materials as well as the level of achieved durability, and many study results have been reported regarding these issues. For example, thin DLC film is likely effective in medical device applications that make up a large market for technologies to form thin DLC film, because conventional medical devices do not provide sufficient compatibility or antithrombotic effect with respect to human body tissues such as blood and interior walls of blood vessels. Also, there are studies showing that thin DLC film containing fluorine can further improve the antithrombotic effect and lubrication property of catheters and implant-type medical devices. If such DLC can be formed more cost-effectively, DLC applications should expand further.

SUMMARY OF THE INVENTION

The quantities of waste animal bones have been increasing in recent years as our diet improves and the meat industry expands. However, no effective means have heretofore been available for processing these waste animal bones that are considered industrial waste.

On the other hand, human or pet remains are traditionally buried or cremated and the ways in which family members can keep the remains of their loved ones have been limited. Also, some patients who had to have parts of their body amputated as a result of an accident or disease have been hoping, in vain, to keep their amputated body parts.

In the meantime, composite materials are advancing rapidly to meet the increasing demands of industries, and there are particularly strong needs for composite materials that can offer higher durability such as chemical resistance, surface hardness, wear resistance and other improved properties on their surface. Formation of thin diamond-like carbon (DLC) film has been drawing the attention as a very effective surface processing technology to improve the aforementioned properties, and there has been hope for the development of more economical DLC formation technology.

During the course of development of better DLC technology, it was found that forming thin DLC film using bone components as a base material and thus regenerating bone components as esthetically pleasing ornamental memorial pieces was also a viable application.

As a result, the inventor aimed and examined ways to utilize waste bones or cremains as high added-value functional materials for use in industrial chemical processes and also create ornaments such as memorial pieces, and finally developed the present invention.

In the present invention, thin diamond-like carbon (DLC) film includes diamond itself.

The invention described in this application for patent is the result of earnest research efforts to solve the problems mentioned above. The inventor took interest in effectively utilizing carbon sources contained in cremains or bones which were traditionally disposed of as waste, except for small quantities utilized in feeds, for medical use, and in other applications, and thus making products offering high added value. Through the pursuit of this aim, the present invention was developed.

The present invention basically comprises the following methods:

[1] A method of producing esthetically pleasing ornaments, characterized by removing metal components from bone components by means of acid and forming diamond-like thin film through gasification and plasma processing of carbon components.

[2] A method of producing esthetically pleasing ornaments according to [1], characterized in that the diamond-like thin film is formed through generation of plasma by means of microwave or high-frequency heating.

In the present disclosure, "bone components" include bones which include non-mammal animal bones, non-human mammal bones, and human bones, cremains of non-mammal animal (e.g., fish and birds), non-human mammal (e.g., cats and dogs), human remains unless specified otherwise, and any other components derived from bones or cremains of animals (including humans).

Here, DLC stands for "Diamond-Like Carbon" and refers to a substance mainly comprising carbon atoms with a trace amount of hydrogen atoms. While diamond that consists of carbon atoms has a diamond structure ($SP^3$) and graphite that also consists of carbon atoms has a graphite structure ($SP^2$), DLC contains both $SP^3$ and $SP^2$ structures as well as some amorphous structures constituted by hydrogen bonds.

In general, diamond-like carbon film is formed on a surface of a member by introducing, into a vacuum system, the target member as well as a carrier gas such as hydrogen and a carbon source such as methane, ethane, propane, butane or other paraffin gas or ethylene, acetylene or benzene gas, and then ionizing these gases.

By gasifying carbon components isolated from bone components and then generating plasma via microwave or high-frequency heating in the presence of hydrogen gas, the inventor successfully formed thin DLC film over the base material that had excellent properties equivalent to those of thin DLC film formed by methane or other paraffin-based hydrocarbon, ethylene or other carbon component. This achievement not only allows for reduction of waste bones and enables their effective utilization as functional materials, but it also permits production of DLC-treated memorial pieces made from bone components.

As explained above, the technology proposed by the present invention is intended to reduce industrial waste and produce high added-value products and therefore has social significance.

DETAILED DESCRIPTION OF THE PREFERRED EMBODIMENT

Under the present invention, thin DLC film may be formed from bone components through the following steps:

(1) Remove metal components in the bone components using hydrochloric acid or other acid, while maintaining carbon components.

(2) Heat and bubble the acid from which calcium chloride and certain other substances have been removed and in which protein components are still dissolved.

(3) Introduce into a vacuum CVD furnace the gas containing a lot of carbon obtained as a result of bubbling.

(4) Also introduce a sufficient volume of hydrogen gas into the CVD furnace and adjust the pressure to a range of 0.1 to 100 Torr.

(5) Generate a plasma by means of microwave or radio-frequency heating.

(6) Adjust the temperature of a substrate made of a superalloy or silicon substrate, for example, to a range of 700 to 1,000° C.

(7) When the above condition is maintained for 30 to 60 minutes or so, diamond-like carbon film will deposit on the substrate to a thickness of approx. 1 micron.

Bones consist of organic and inorganic matters, where organic components that mainly include calcium phosphate, calcium carbonate and magnesium phosphate account for 50 to 60% of the total bone mass. The key elements that make up bone include carbon (52%), oxygen (23%), nitrogen (16%), hydrogen (7%), sulfur (1%) and phosphorus (0.5%), with other minerals such as sodium, calcium, magnesium, chlorine, iodine, copper, iron and silicon constituting the remaining 0.5%.

Organic matters resulting from the carbon content of bone give resilience to bone, while inorganic matters make bone hard. When calciferous is removed from bone through the effect of acid, the resulting bone that consists solely of organic components becomes very soft like cartilage.

Approx. 90% of all proteins comprising bone is collagen, which provides the structural frame of the bone matrix. Other proteins are collectively referred to as non-collagen proteins, many of which are glycoproteins. Bone collagen is almost solely I-type and can be solubilized using 0.5M acetic-acid or 0.1 to 0.3M citric-acid buffer solution (pH 3.5 to 3.7) or other acid. Acid-insoluble proteins are solidified and etched by hydrogen plasma or dissolved in solvent and bubbled, while proteins dissolved in acid are gasified directly through bubbling, to form thin diamond-like carbon (DLC) film.

The composition of cremated human or pet remains varies depending on the burning temperature. If the burning temperature is low, protein components remain, and if the burning temperature is high, protein components are broken down, and thus carbon components can be extracted together with carbon components derived from inorganic components, by dissolving organic components with acid. Thus obtained carbon components from bone components are gasified and introduced into a furnace together with hydrogen gas.

Prior to the above, metal components of the bone components are removed by means of hydrochloric acid or other acid while maintaining carbon components. The acid, from which calcium chloride and certain other substances have been removed but in which protein components are still dissolved, is heated and bubbled, and the obtained gas containing carbon is introduced into a vacuum CVD furnace. At the same time, a sufficient volume of hydrogen gas is introduced into the CVD furnace and the pressure is adjusted to a range of 0.1 to 100 Torr (preferably 1 to 100 Torr). Next, plasma is generated by means of microwave or high-frequency heating and the temperature of a substrate made of a super-hard alloy or silicon substrate, for example, is adjusted to a range of 700 to 1,000° C. When the above condition is maintained, thin diamond-like carbon (DLC) film can be formed on the substrate in a time period as short as 10 seconds, and within 30 to 60 minutes a thickness of the film can reach approx. 1 micron. Thus, by adjusting the duration of film formation, the film having a desired thickness can be formed.

In general, diamond-like carbon film is formed on the surface of a member by introducing, into a vacuum system, the target member as well as a carrier gas such as hydrogen and a carbon source such as methane, ethane, propane, butane or other paraffin gas or ethylene, acetylene or benzene gas, and then ionizing these gases.

The present invention uses, as a material gas, a gasified form of carbon source obtained by acid-processing bone components that were traditionally disposed of as waste, and it is possible to control the flow rate using a float-type flow meter. As a method to form thin DLC film on the base material, the parallel-plate, high-frequency plasma chemical vapor deposition (CVD) method is used. The system used is a parallel-plate, high-frequency plasma CVD system that uses disc-shaped electrodes installed in parallel inside the chamber to generate plasma through high-frequency discharge. Since the consumption efficiency of high-frequency power varies significantly depending on the impedance in the chamber, a matching box (impedance adjuster) is provided on the outside of the system. Efficiency can be increased by adjusting this matching box. The exhaust system comprises a rotary pump and a mechanical booster pump, and these rotary and mechanical booster pumps are used to create a vacuum of $1.7 \times 10^{-3}$ Torr in the chamber. To form thin DLC film, a material gas containing carbon components isolated from bone components is introduced into the chamber and the pressure is adjusted to 0.1 Torr. Plasma is generated by high-frequency discharge, and thin DLC film is deposited for 10 seconds over a base material placed on the electrodes.

A member comprising a base material and thin DLC film formed over its surface provides a notably increased level of chemical resistance, or resistance to acids and other chemicals; exhibits high hardness, clearly expected from a structure similar to that of diamond, resulting in strong scratch-proof property of the surface of the base material; and can also have the thickness of thin DLC film adjusted to a level smaller than Teflon film because, among others, the wear level of thin DLC film is lower than that of Teflon film, the lubrication property of thin DLC film is equivalent to or better than that of Teflon film, and formation of very thin DLC film is technically feasible. The last point makes it possible to provide surface treatment over members of fine shapes.

As explained above, thin diamond-like carbon film provides a thin layer offering excellent chemical resistance, high hardness and wear resistance. If the thin film has many $SP^3$ bonds with respect to $SP^2$ bonds, however, an elevated level of cohesive power within the thin film will cause the film to break at the interface with the base material if stress is received, i.e., the film will exhibit a tendency to separate due to interface failure.

The adhesion of thin diamond-like film and base material can be improved by providing an area having a lower $SP^3/SP^2$ ratio than the that at the film surface, at a location within 0.1 micron from the interface of thin film and core material. The carbon film can have various crystal structures, but the present invention aims to improve film adhesion by forming both $SP^3$ bond (diamond bond) and $SP^2$ bond (graphite bond) and also increasing the amount of $SP^2$ bonds near the interface with the base material. $SP^3$ bond (diamond bond) is the strongest bond and therefore provides excellent mechanical characteristics. If there are more $SP^2$ bonds than $SP^3$ bonds, wear resistance drops. However, graphite bond has a laminar structure consisting of a series of carbon atoms forming a hexagonal ring, and weak Van der Waals force is generated between the atom layers. This produces the effect of stress distribution, and consequently the inter-phase adhesion with the member improves.

The following explains embodiments of the present invention using examples. It should be noted, however, that the present invention is not at all limited to these examples.

Example 1

Cremains of a pet were retrieved from a crematorium with an owner's consent and were pulverized using a pulverizer. 50 g of pulverized cremains were washed and then immersed in 0.5M acetic acid for 24 hours, thereby removing ash and dissolving protein therein. By bubbling the acid solution wherein the protein was dissolved, gaseous components were generated, which were then introduced into a microwave plasma CVD apparatus wherein a sapphire substrate was placed. A film was deposited on the substrate under conditions where a pressure was 50 Torr, a temperature was 700° C., a microwave output was 600 W, and duration was two hours.

The substrate was taken out from the chamber and was subjected to X-ray diffraction analysis. It was confirmed that a diamond-like carbon film was formed on the substrate. The thickness of the film was 4 μm as a result of observation by a scanning electron microscope.

In the above, in place of the sapphire substrate, stainless steel parts used in high-quality watches or ornaments such as accessories can be used and coated with a diamond-like carbon film using carbon components derived from cremains of pet remains. The thus-obtained watches or ornaments can possess a sentimental value and can be kept by owners as mementos of their pets. The diamond-like carbon film has a luxurious black glossy surface and has excellent resistance to abrasion and chemicals. The skilled artisan in the art can readily understand that human cremains can also be used in the same way.

In the present disclosure where conditions and/or structures are not specified, the skilled artisan in the art can readily provide such conditions and/or structures, in view of the present disclosure, as a matter of routine experimentation.

Test Example 1

Chemical Resistance Test

A sample prepared by DLC-treating an iron sheet (25 mm×25 mm in size and 1 mm in thickness) in accordance with this application for patent, and another unprocessed sample, were sealed by solid paraffin along their periphery so that the surface of iron sheet of 20 mm×20 mm in size remain unsealed. These two iron-sheet samples (with and without DLC treatment) were soaked for 72 hours in a specified 0.1 aqueous hydrochloric acid solution maintained at 25° C., and then the surface of each sample was observed. As a result, although the surface of the sample DLC-treated in accordance with this application for patent exhibited the same condition it had before the soak, the sample without DLC treatment showed rough, irregular surface and the soak solution had turned slightly yellow. These results suggest significant improvement in the chemical resistance of DLC-treated surface.

Test Example 2

Surface Hardness Test

Two samples were prepared in the same manner as in Example 1, and an X mark was engraved on the surface of each sample using an OLFA metal blade. A clear X mark was engraved on the surface of the sample without DLC treatment, but the X mark on the surface of the DLC-treated sample was unclear. This suggests that the surface of the DLC-treated sample had a film harder than the metal blade.

Test Example 3

Surface Wear Test of Base Material

To conduct a comparative evaluation of slide characteristics between base materials with and without DLC treatment conforming to this application for patent, a ring-shaped (Ø30) carbon steel (S20C) was caused to rotate at 0.2 m/s to slide over samples with and without DLC treatment, prepared in the same manner as in Example 1, in water under a load of 100 g. Wear level was examined after 10 minutes and the wear widths were compared. The evaluation scales were: x for 5 mm or more, Δ for 3 to 5 mm, ○ for 1 to 3 mm, and ◎ for 1 mm or less. The test result for the surface of the DLC-treated sample was ◎, while the result for the surface of the sample without DLC treatment was Δ. From the above results, it is considered that the DLC treatment proposed in this application for patent improved the surface hardness of the sample significantly, thereby making it more resistant to wear under friction even with carbon steel.

What is claimed is:

1. A method of producing ornaments using bone components, comprising:
   (i) removing metal components in bone components using acid to form an acid solution;
   (ii) heating and bubbling the acid solution to generate gaseous carbon components;
   (iii) introducing the gaseous carbon components and hydrogen gas into a vacuum CVD furnace wherein a substrate is placed, the pressure is adjusted to a range of 0.1 to 100 Torr, and the temperature of the substrate is adjusted to a range of 700 to 1,000° C.; and
   (iv) generating a plasma by applying microwave or radio-frequency power, thereby depositing a diamond-like carbon film on the substrate.

2. The method according to claim 1, wherein in step (i), the acid is hydrochloric acid.

3. The method according to claim 1, wherein in step (i), the metal components to be removed include calcium chloride.

4. The method according to claim 1, wherein in step (i), the acid solution contains dissolved protein components derived from the bone components.

5. The method according to claim 1, wherein in step (iii), the substrate is made of a super-alloy or silicon.

6. The method according to claim 1, wherein when in step (iv), the diamond-like carbon film has a thickness of 1 μm.

7. The method according to claim 1, wherein in step (iv), the plasma is maintained for 30 to 60 minutes.

8. The method according to claim 1, wherein the bone components are bones or cremains of animal remains.

9. The method according to claim 8, wherein the bone components are cremains of animal remains.

* * * * *